(12) United States Patent
Cirel (10) Patent No.: US 7,397,244 B2
(45) Date of Patent: Jul. 8, 2008

(54) GRADIENT BORE COOLING PROVIDING RF SHIELD IN AN MRI SYSTEM

(75) Inventor: Christopher Mark Cirel, Oxon (GB)

(73) Assignee: General Electric Company, Schenectady, NY (US)

( * ) Notice: Subject to any disclaimer, the term of this patent is extended or adjusted under 35 U.S.C. 154(b) by 125 days.

(21) Appl. No.: 11/161,863

(22) Filed: Aug. 19, 2005

(65) Prior Publication Data

US 2006/0082370 A1 Apr. 20, 2006

(30) Foreign Application Priority Data

Oct. 20, 2004 (GB) ................................. 0423325.0

(51) Int. Cl.
*G01V 3/00* (2006.01)
(52) U.S. Cl. .................. 324/318; 324/319; 324/322
(58) Field of Classification Search ......... 324/300–322, 324/324; 600/410, 411, 420
See application file for complete search history.

(56) References Cited

U.S. PATENT DOCUMENTS

| | | | | |
|---|---|---|---|---|
| 5,278,502 | A | 1/1994 | Laskaris | 324/318 |
| 5,367,261 | A | 11/1994 | Frederick | 324/318 |
| 6,111,412 | A * | 8/2000 | Boemmel et al. | 324/318 |
| 6,232,548 | B1 | 5/2001 | Eberler et al. | |
| 6,236,207 | B1 * | 5/2001 | Arz et al. | 324/318 |
| 6,252,404 | B1 | 6/2001 | Purgill | 324/318 |
| 6,441,614 | B1 | 8/2002 | Edelstein | 324/318 |
| 6,456,074 | B1 | 9/2002 | Minas | |
| 6,774,631 | B2 * | 8/2004 | Heid | 324/318 |
| 6,867,592 | B2 * | 3/2005 | Gebhardt et al. | 324/318 |
| 6,909,283 | B2 * | 6/2005 | Emeric et al. | 324/300 |
| 6,992,483 | B1 * | 1/2006 | Emeric et al. | 324/300 |
| 7,015,692 | B2 * | 3/2006 | Clarke et al. | 324/300 |
| 7,154,270 | B2 * | 12/2006 | Arz et al. | 324/318 |
| 2001/0033168 | A1 * | 10/2001 | Heid | 324/322 |
| 2003/0206018 | A1 * | 11/2003 | Gebhardt et al. | 324/318 |
| 2004/0017195 | A1 | 1/2004 | Kassal et al. | 324/315 |
| 2004/0119472 | A1 | 6/2004 | Laskaris | 324/318 |
| 2005/0030028 | A1 * | 2/2005 | Clarke et al. | 324/318 |
| 2005/0035764 | A1 * | 2/2005 | Mantone et al. | 324/318 |

(Continued)

FOREIGN PATENT DOCUMENTS

EP 0737867 10/1996

(Continued)

OTHER PUBLICATIONS

European Search Report and Written Opinion for application No. 05256359.0 dated Dec. 22, 2005.

*Primary Examiner*—Brij Shrivasatav
*Assistant Examiner*—Tiffany A Fetzner
(74) *Attorney, Agent, or Firm*—Cantor Colburn LLP (57) ABSTRACT

A magnetic resonance imaging (MRI) device for imaging a volume includes a main magnet for generating a magnetic field, an insulator sheet formed into a tube extending along an axis, a gradient coil disposed on an outside surface defining the tube for manipulating the magnetic field generated by the main magnet to image the volume, and a cooling circuit disposed between the gradient coil and a RF coil. The cooling circuit is disposed on an opposite inside surface defining the tube, wherein the cooling circuit shields the gradient coil from the RF coil while cooling the gradient coil.

23 Claims, 5 Drawing Sheets

U.S. PATENT DOCUMENTS

2005/0168222 A1* 8/2005 Arz et. al. .................. 324/318
2006/0082370 A1* 4/2006 Cirel .......................... 324/318

FOREIGN PATENT DOCUMENTS

| | | |
|---|---|---|
| GB | 2397654 A | 12/2003 |
| JP | 06269422 | 12/1994 |
| JP | 01068248 A | 8/1999 |

* cited by examiner

GRADIENT BORE COOLING PROVIDING RF SHIELD IN AN MRI SYSTEM

BACKGROUND OF THE INVENTION

This application claims the benefit of a priority under 35 U.S.C. 119 to Great Britain Patent Application No. 0423325.0 filed Oct. 20, 2004, the entire contents of which are hereby incorporated by reference.

This invention generally relates to a radio frequency (RF) and gradient coil arrangement for a magnetic resonance (MR) imaging system or scanner. More particularly, the invention pertains to an arrangement wherein the RF coil of the MR scanner is selectively mounted in relation to other components of the scanner, to substantially increase RF coil performance, by maximizing separation therebetween while sufficiently cooling the gradient primary coil.

As is well known, a MR imaging system or scanner commonly includes a cryostat, which contains a powerful superconductive main magnet positioned around a main magnet bore. The superconductive magnet is maintained at an extremely cold temperature and produces a strong static magnetic field, or $B_0$ field, within the bore, the $B_0$ field being directed along the bore axis. Other essential components of the MR system include the RF coil, or RF antenna, and the gradient coil assembly, which comprises a hollow cylindrical structure. The RF coil may be operated in a transmit mode, to generate MR signals in an imaging subject, or may be operated in a receive mode to detect the MR signals. The gradient coil assembly comprises one or more cylindrical coil forms, as well as a set of gradient coils supported thereby, to produce the X-, Y-, and Z-gradient magnetic fields. These fields are required to spatially encode MR data. Typically, the gradient coil assembly is positioned within the main magnet bore.

In the past, it has been common practice to support the RF coil within the main magnet bore by attaching it to a further essential MR system component comprising an inner cylindrical form. The inner form comprises a tubular member which is inserted through the gradient coil assembly, in coaxial relationship therewith. The interior region of the inner tubular member generally comprises the patient bore or imaging volume of the associated MR system, that is, the volume which is disposed to receive a patient, and in which MR signals are generated and detected. The ends of the inner tubular member are attached to the cryostat, by means of end caps or the like, so that the tubular member is supported thereby. Typically, the RF coil is placed around the outside diameter of the inner tubular member, in close adjacent relationship, and supported or carried thereby. The tubular member is made of a non-electrically conductive material, so that it does not impede RF performance within the imaging volume.

As is well known, an MR system requires a RF coil to generate the $B_1$ field, necessary to produce MR data while the set of three gradient coils are required to spatially encode the MR data. Both the RF and gradient coils are positioned around the MR magnet bore, which receives the patient or other imaging subject. The gradient coils are typically positioned outside the RF coil so that fields generated by the gradient coils must extend past the RF coil in order to reach the magnet bore.

In a typical coil assembly, the radio frequency coil is located within the gradient coils with a relatively small spacing therebetween. The close physical proximity of these different coils results in a significant amount of the energy from the RF excitation field being lost due to impingement upon the gradient field coil structure. This loss shows up as a damping of the quality factor (Q) of the contained radio frequency coil which, in turn, degrades the normally attainable signal-to-noise ratio of the imaging device. Accordingly some type of RF shielding is usually placed between the radio frequency and gradient coils to preserve the Q of the former coil and consequently the signal-to-noise ratio of the system.

If coupling occurs between the RF and gradient coils, the gradient coils will absorb or "suck away" RF coil energy. This causes the Q, or quality factor, of the RF coil as well as the signal-to-noise ratio thereof, to be significantly reduced. To prevent such absorption of RF coil power or energy, it has become common practice to place a RF shield between the RF coil and the gradient coils. From the standpoint of preventing RF coil power absorption, an ideal shield would be a cylinder of solid copper, or like conductive material, positioned between the RF and gradient coils. The RF field would induce image currents in the solid copper cylinder, which would serve to reflect the RF field so that it could not interact with the gradient coils. However, such a solid shield would also seriously attenuate gradient fields extending into the MR magnet bore.

In prior art arrangements, the RF coil and RF shield are located between the patient enclosure and gradient primary coils. To increase RF coil performance, the separation between the RF coil and RF shield should be increased while maintaining the RF shield disposed inside the gradient coils. To increase gradient coil performance, the gradient primary coils should be located as near to the patient enclosure as possible. The inside surface of the gradient primary coils needs to be cooled to prevent the coils from overheating and to maintain the patient enclosure temperature within regulatory limits. However, this cooling layer takes up space between the RF shield and primary gradient coils. Positioning the RF shield between the cooling layer and gradient primary coil decreases the cooling performance because the gap between the cooling layer and gradient coil is increased.

Accordingly, there is a desire to maximize cooling by minimizing the gap between the cooling layer and gradient coil, while maximizing RF performance by locating the RF shield next to the gradient primary coil.

BRIEF DESCRIPTION OF THE INVENTION

The foregoing problems and disadvantages are overcome by a gradient coil assembly and method for manufacturing assembly in accordance with the exemplary embodiments disclosed herein.

A magnetic resonance imaging (MRI) device for imaging a volume in accordance with exemplary embodiments includes a main magnet for generating a magnetic field, an insulator sheet formed into a tube extending along an axis, a gradient coil disposed on an outside surface defining the tube for manipulating the magnetic field generated by the main magnet to image the volume, and a cooling circuit disposed between the gradient coil and a RF coil. The cooling circuit is disposed on an opposite inside surface defining the tube, wherein the cooling circuit shields the gradient coil from the RF coil while cooling the gradient coil.

A magnetic resonance imaging (MRI) device for imaging a volume in accordance with another exemplary embodiment includes means for generating a main magnetic field, means for manipulating the main magnetic field to image the volume, a means for cooling the means manipulating the main magnetic field to image the volume, and an insulator sheet formed into a tube extending along an axis. The insulator sheet is intermediate the means for manipulating the main magnetic field to image the volume and the cooling means. A RF coil is spaced apart and extends radially inwardly from the cooling means. The cooling means is disposed on an opposite inside surface defining the tube, wherein the cooling means shields the means for manipulating the main magnetic field to image the volume from the RF coil while cooling the means for manipulating the main magnetic field to image the volume.

In another exemplary embodiment, a magnetic resonance imaging (MRI) system includes a superconductor magnet for generating a magnetic field for imaging a volume, an unshielded gradient coil for manipulating the magnetic field, and a cooling system including a cooling circuit thermally coupled to the superconductor magnet. The cooling circuit shields the gradient coil from a RF coil while cooling the gradient coil.

In yet another exemplary embodiment, a magnetic resonance imaging (MRI) device for imaging a volume includes at least one superconducting coil operating at cryogenic temperatures for generating a magnetic field, at least one gradient coil for manipulating the magnetic field generated by the at least one main magnet to image the volume, and a cooled thermal spreader having at least one cooling duct abutting gradient coil layers providing RF shielding from a RF coil. The at least one cooling tube being coupled to a cryocooler heat exchanger.

In still another exemplary embodiment, a magnetic resonance imaging (MRI) device for imaging a volume includes at least one main magnet for generating a magnetic field, at least one gradient coil for manipulating the magnetic field generated by the at least one main magnet to image the volume, and at least one cooled thermal spreader. The at least one cooled thermal spreader comprising one of: a cooled thermal shield, and a cooled coil former on which the gradient coil is wound.

In still another exemplary embodiment, a method of combining a cooling circuit and a RF shield for a magnetic resonance imaging (MRI) device for imaging a volume is disclosed. The method includes disposing a gradient coil for manipulating a magnetic field generated by a main magnet to image the volume on an outside surface of an insulator sheet, and disposing a cooling circuit on an opposite inside surface of the insulator sheet. The cooling circuit is disposed between the gradient coil and a RF coil, wherein the cooling circuit shields the gradient coil from the RF coil while cooling the gradient coil.

Other systems and/or methods according to the embodiments will be or become apparent to one with skill in the art upon review of the following drawings and detailed description. It is intended that at all such additional systems, methods, and/or computer program products be within the scope of the present invention, and be protected by the accompanying claims.

DETAILED DESCRIPTION OF THE INVENTION

Reference will now be made in detail to presently preferred embodiments of the present invention. Wherever possible, the same reference numbers will be used throughout the drawings to refer to the same or like parts.

Figure 1:
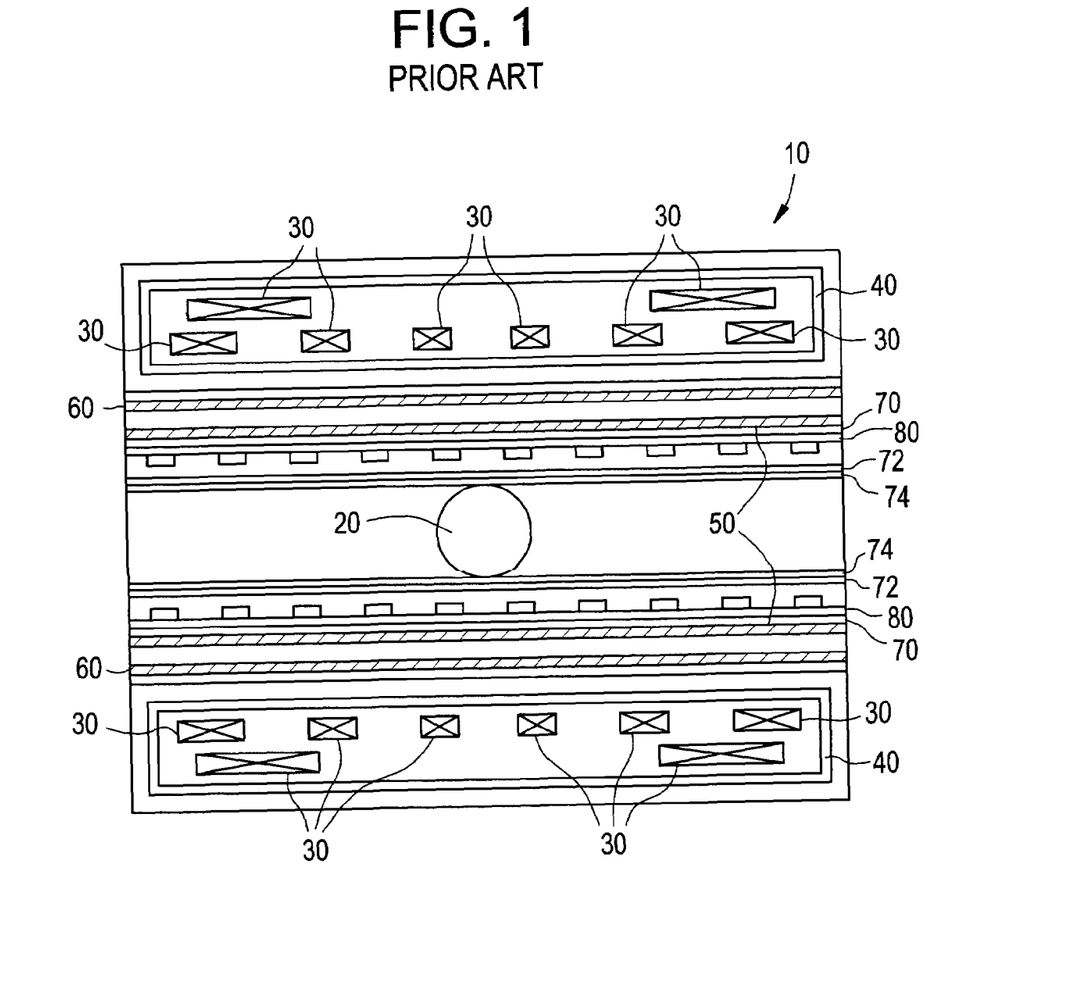
FIG. 1 is a cross sectional view of a known MRI device.

As shown in FIG. 1, known superconducting (SC) MRI devices 10 typically employ windings 30 for generating a homogeneous magnetic field in an image volume 20, the windings 30 operating in liquid helium to maintain the temperature at approximately 40° K. The liquid helium pool requires a vessel 40 which is vacuum tight and which meets American Society of Mechanical Engineering (ASME) pressure vessel requirements; such a vessel 40 is typically made of welded aluminum alloy cylinders and flanges. Thermal radiation shields (not shown), of which two are typically used, are also made of welded aluminum pieces and contain the helium vessel 40.

When the gradient coils 50 in the bore of the MRI device 10 are electrically pulsed, the resulting time changing magnetic flux in any of the electrically conducting cylinders surrounding the gradient coils induces eddy currents. These eddy currents in turn produce their own magnetic fields which degrade the quality of the desired gradient field in space and time. A second set of gradient coils 60 (i.e., shield gradient coils) in the magnet bore compensate for the aggressive pulse sequences which are routinely used in MR imaging today. These shield gradient coils 60 set up fields which counteract those of the main gradient coil 50 in the region outside of the shield coil 60, thus greatly reducing any mutual inductance with conducting members, such as the thermal shields, and minimizing the resultant eddy currents.

A tubular RF shield 70 is located coaxially around a RF coil 72 surrounding patient enclosure 74. RF shield 70 is typically fabricated from a sheet of conductive material, such as copper which has been rolled into a cylindrical shape which corresponds to the shape of RF coil 72.

As discussed above, the RF coil 72 and RF shield 70 are located between the patient enclosure 74 and gradient primary coils 50. Furthermore, the inside surface of the gradient primary coils 50 needs to be cooled with a cooling layer 80 to prevent the coils from overheating and to maintain the patient enclosure temperature within regulatory limits. This cooling layer 80 takes up space between the RF shield 70 and primary gradient coils 50. Positioning the RF shield 70 between the cooling layer 80 and gradient primary coil 50 decreases the cooling performance because a gap between the cooling layer 80 and gradient coil 50 is increased.

Figure 2:
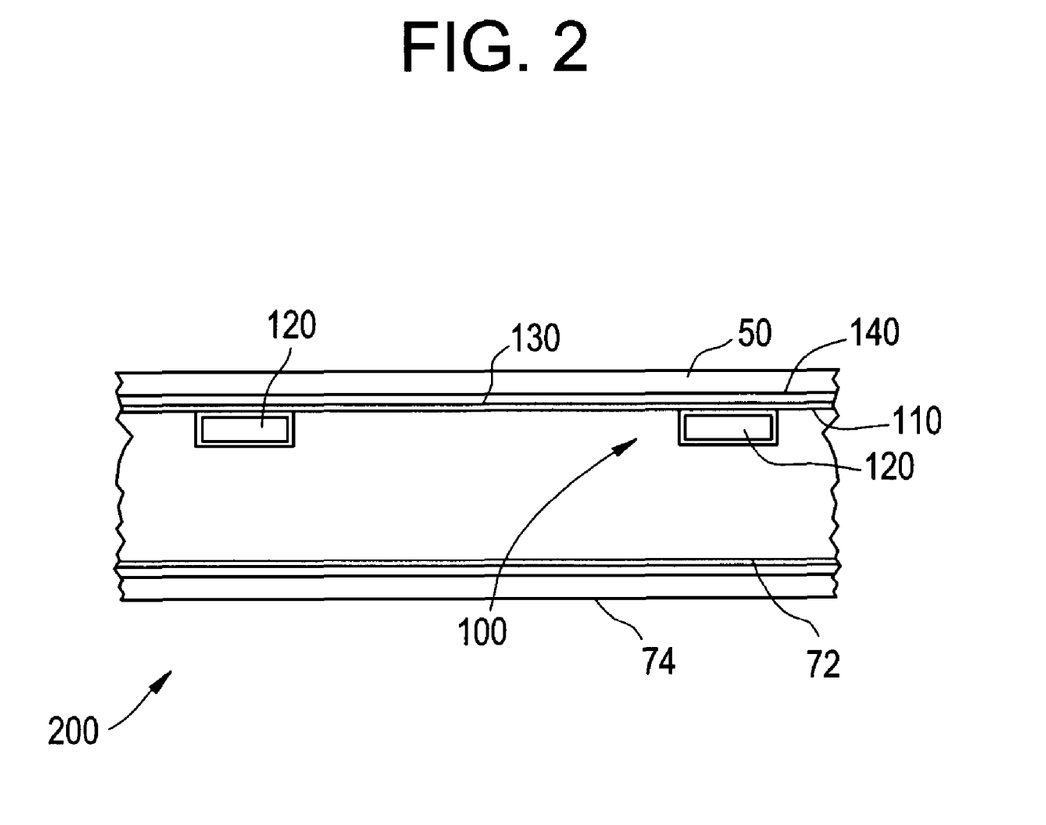
FIG. 2 is an enlarged partial cross sectional view of a MRI device according to an embodiment of the present invention.

Referring now to FIG. 2, a cooling layer and RF shield combination device 100 is disposed intermediate gradient coils 50 and RF coil 72 in an exemplary embodiment of a MRI device 200. In this manner, a separate RF shield 70 is not disposed between the gradient coils 50 and cooling layer 80 as in FIG. 1. By combining the RF shield and gradient primary coil bore cooling into one component, an optimum interface between the RF coil 72 and gradient coils 50 results while maintaining gradient design requirements described earlier. In particular, the design requirements met include: 1) locating the RF shield as far away from RF coil as possible while still being inside the gradient primary coils, and 2) locating the gradient bore cooling circuit as near as possible to the gradient primary coil.

According to this embodiment, a cooling circuit of the combined cooling layer and RF shield includes a heat spreader 110 configured as a conduction cooled cylindrical array of fins that is provided with the primary gradient coils 50 for thermally shielding and/or cooling the primary gradient coils 50. Preferably the coil former or heat spreader 110 is made of a non-magnetic, thermally, and electrically conductive material, such as copper, for example; however, other materials such as replacing copper with aluminum, etc. could also be used. Hence, it should be appreciated that the heat spreader 110 is slit into an array of fins of suitable thickness to provide low thermal resistance and in which eddy currents are not substantially produced during operation of the gradient coils 50. The bore of the patient enclosure 74 is also made substantially of eddy current free materials.

As shown in FIG. 2, one or more cooling tubes or ducts 120 are mounted to the heat spreader 110 with a thermally, and electrically conductive joint. The cooling tubes or ducts 120 are arranged with the pattern of slits in the heat spreader 110 so that conductive eddy current loops cannot be formed.

The cooling ducts 120 are configured to pass a cooling medium (e.g., chilled water, etc.) about the heat spreader 110, thereby cooling the gradient primary coils 50. It should be appreciated that the size and number of ducts of the cooling ducts 120 depends on many heat transfer design details including, but not limited to, overall size, flow rate and resistance, materials, and the heat load of the gradient coil.

Cooling is provided by circulating the cooling medium through the gradient coil, where cold cooling medium heat exchanges with the coil former 110 via the cooling ducts 120, and returns back to the recirculating chiller at a higher temperature.

Referring again to FIG. 2, the combined cooling layer/RF shield 100 is preferably made up from runs of finned cooling duct 120. In other words, heat spreader 110 is finned with a plurality of spaced apart ducts 120 extending from heat spreader 110 having electrical insulation between contiguous ducts 120 generally indicated at 130. MRI device 200 includes an insulation sheet 140 defining a minimized electrical insulation gap between primary gradient coil 50 and heat spreader 110. Insulation sheet 140, therefore, provides minimal thermal resistance between the primary gradient coil 50 and the cooling layer 100 and improves the gradient coil thermal performance.

Figure 3:
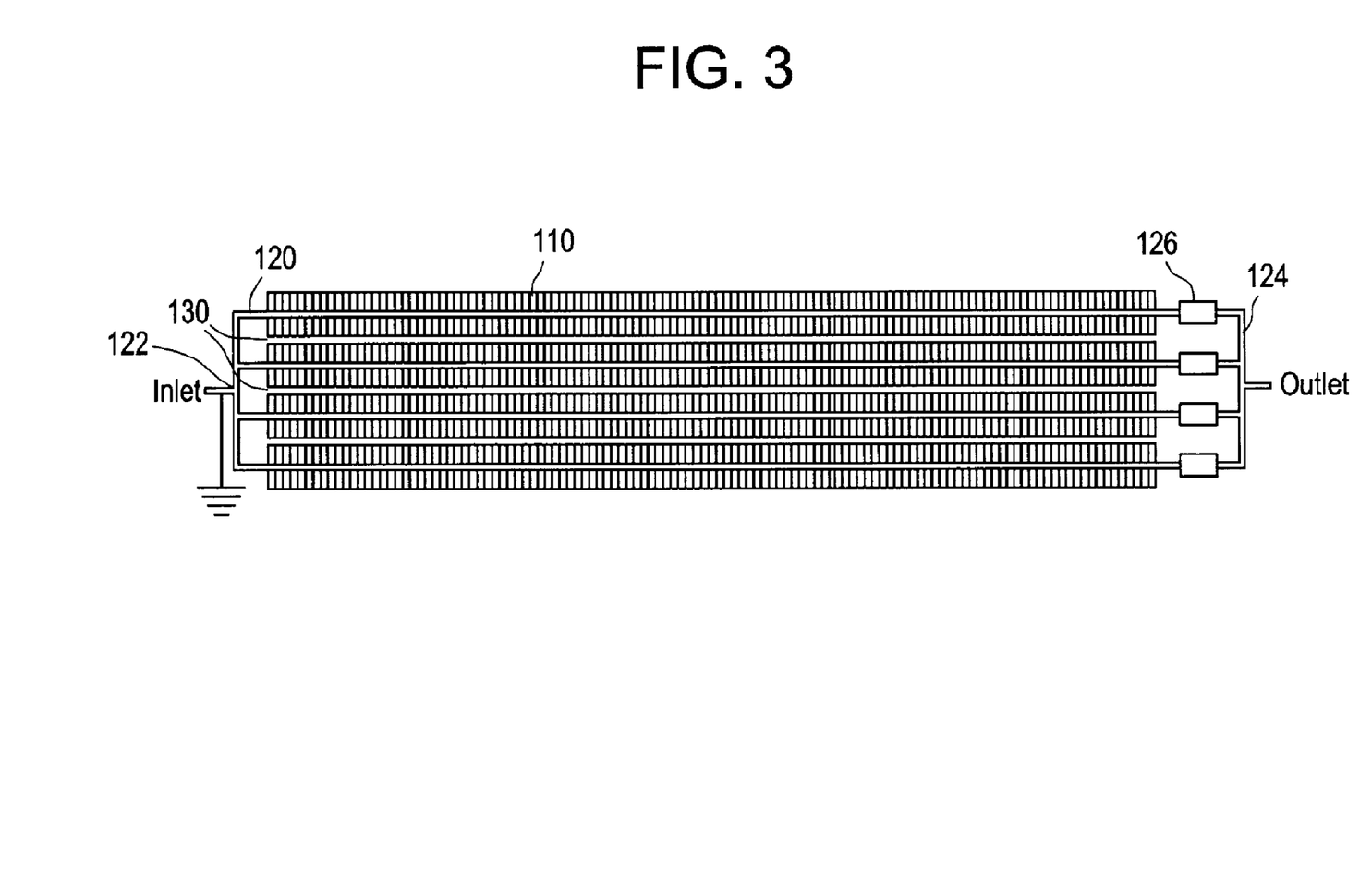
FIG. 3 is a schematic diagram of manifolds operably coupled to cooling ducts at either end of a cooling panel/RF shield according to an embodiment of the present invention.

In exemplary embodiments and referring to FIG. 3, each run of cooling duct 120 is connected to an electrically grounded manifold 122 with an electrically conductive connection at a first end (e.g., inlet) defining one end of the cooling duct. An opposite second end (e.g., outlet) of the cooling duct is then connected to another manifold 124 with a non-electrically conductive connection indicated with electrical isolators 126. In this manner, eddy current losses in the cooling circuit are prevented that can cause an effect on image quality. This manifold arrangement also maximizes the coolant flow rate through the cooling circuit. Apart from the first end of each cooling circuit where the cooling ducts 120 are electrically coupled to a common manifold, each run of finned cooling ducts 120 is electrically isolated from adjacent runs to prevent gradient coil eddy current losses via electrical insulation 130. The cooling duct size, thickness, width and length of fins 110 are chosen to meet the cooling requirements while not causing noticeable gradient coil eddy current losses in the imaging field of view.

It should be noted that the above described finned cooling arrangement provides about 90% uniform surface coverage to prevent temperature hotspots while providing RF shielding. The cooling ducts 120 are each thermally connected to the finned sheet 110 by soft soldering or with a thermally conductive adhesive, for example. The cooling duct 120 and fins 110 are non-magnetic, thermally conductive, and electrically conductive. As such, copper for example, is contemplated for use for cooling ducts 120 and finned sheet 110, but is not limited thereto.

Figure 4:
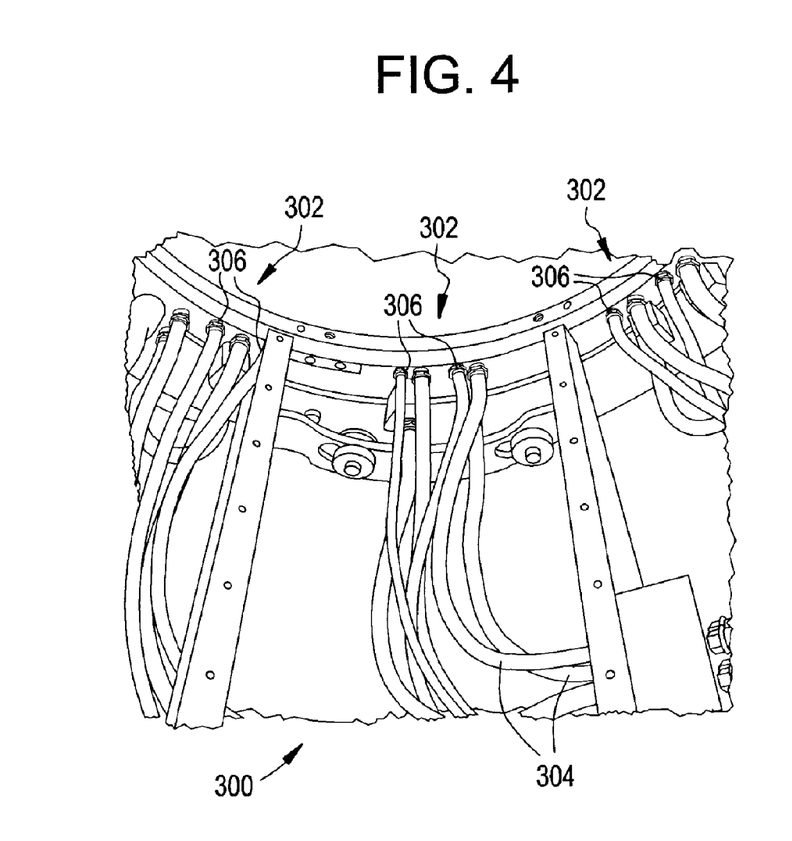
FIG. 4 is a view of an inner bore wall of the MRI device illustrating that one connector from each cooling circuit section is grounded according to an embodiment of the present invention.

Referring now to FIG. 4, an inner bore wall or magnet bore 300 is illustrated showing three (3) of eight (8) cooling circuits 302. Each cooling circuit 302 is operably connected to corresponding cooling ducts 120 to feed and return cooling medium via cooling tubes 304. As illustrated, each cooling circuit 302 includes three (3) cooling feed tubes 304 and three (3) cooling return tubes 304. A 24 gauge ground wire (not shown) is wound around an exposed portion of the cooling circuit 302. The exposed portion corresponds with a copper hose barb 306 interfacing ends of tubes 304 to operably couple with corresponding cooling ducts 120. After the wire is wound around hose barb 306, copper tape is used to secure the electrical connection. Opposite ends of each ground wire extending from corresponding hose barbs 306 are electrically coupled together at a single point of magnet end flange 310 (FIG. 5) or an electrically grounded manifold (not shown).

Figure 5:
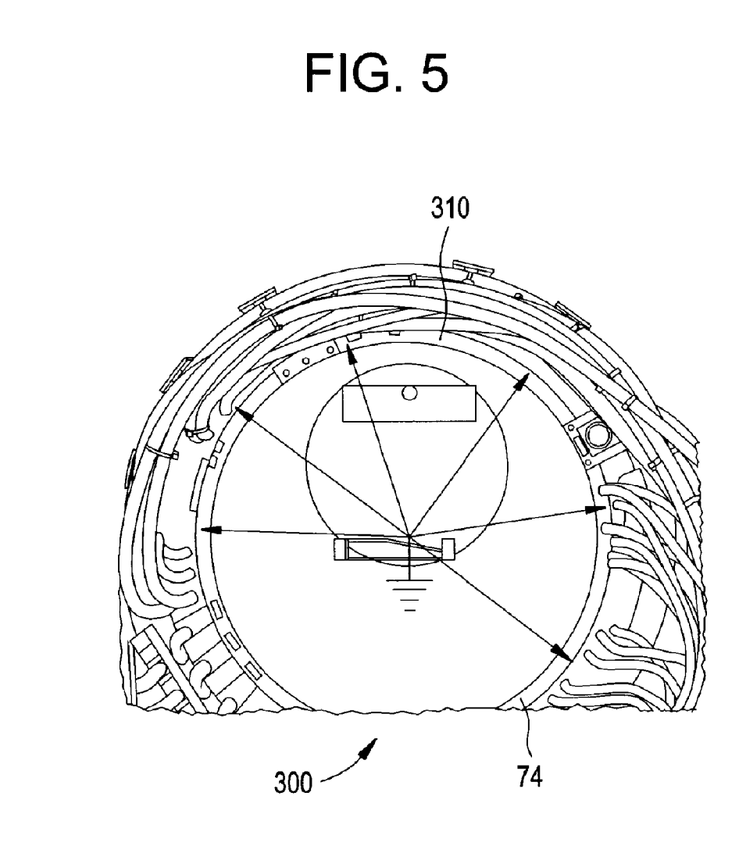
FIG. 5 is an end view of the MRI device of FIG. 4 depicting six of eight cooling circuits being grounded.
Figure 6:
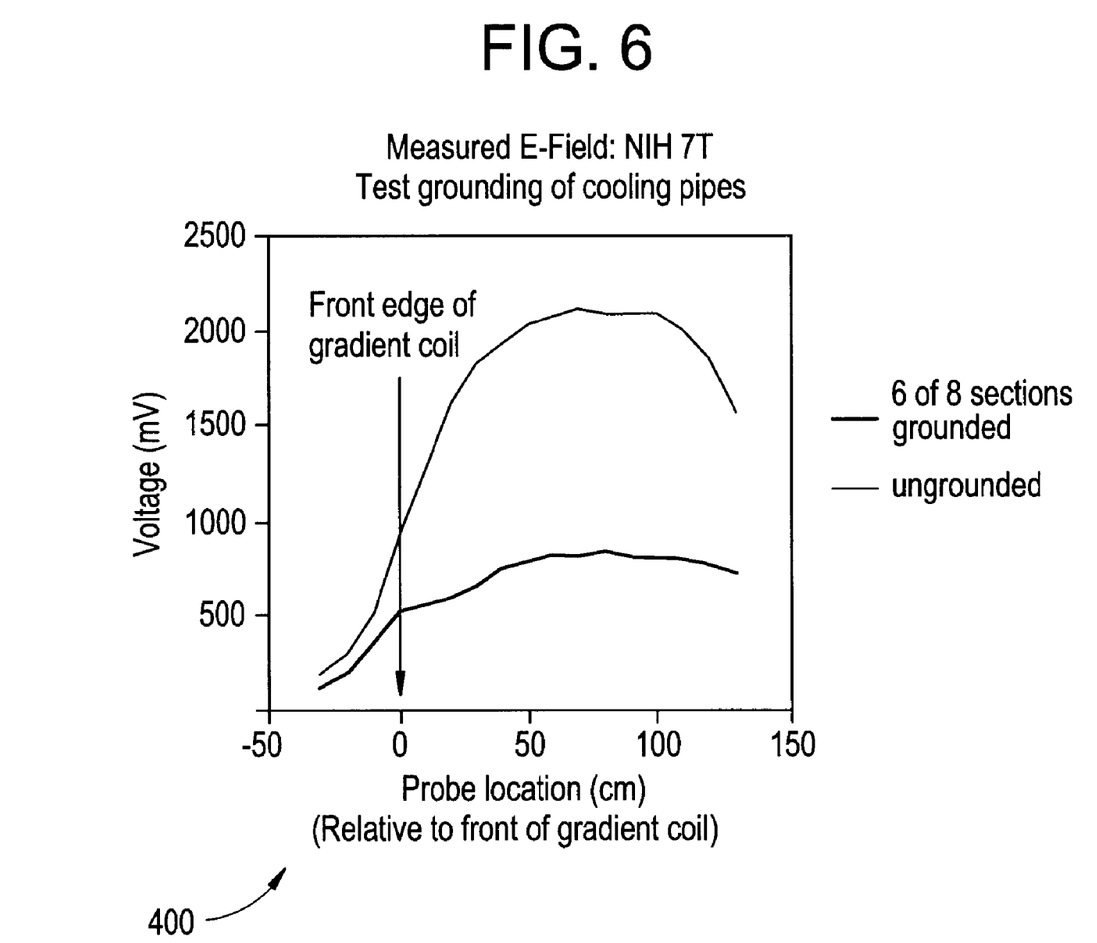
FIG. 6 is graphical illustration of measured gradient-induced electric fields in the magnet bore relative to a front edge of a gradient coil with ungrounded cooling circuits and six of eight grounded cooling circuits, as in FIG. 5.

FIG. 5 illustrates six (6) of a total of eight (8) cooling circuits 302 being grounded. The remaining two (2) cooling circuits are inaccessible with respect to this particular embodiment, and thus are not grounded. FIG. 6 is depicts a graph 400 of measured gradient-induced electric fields in the magnet bore 300 relative to a front edge of a gradient coil with ungrounded cooling circuits versus six of eight grounded cooling circuits 302 as in FIG. 5. The front edge of the gradient coil corresponds to a zero (0) point on an X-axis. The X-axis corresponds to a relative probe location in relation to a distance from the front of the gradient coil or zero point measured in centimeters (cm). A Y-axis of the graph reflects the measured electric field in bore 300 measured in millivolts (mV). It will be recognized with reference to FIGS. 5 and 6 that grounding of the bore-wall gradient coil cooling pipes 304 via hose barbs 306, for example, significantly reduces an electric field in bore 300.

Gradient-induced electric fields in the magnet bore 300 have been shown previously to interact with the RF subsystem components, and specifically with passive diodes, resulting in signal loss and artifacts. Providing a grounded shield layer such as a separate RF shield on the inside diameter (ID) of the bore wall dramatically reduces the in-bore electric field and associated imaging issues. However, in some present MRI devices, there is no RF shield to provide this ground plane. Therefore, in a MRI device having integral cooling pipes and heat spreaders, grounding at least a portion of the cooling pipes provides some degree of shielding. In particular, connecting ground wires to the inner bore wall cooling circuits in the gradient coil is effective in reducing in-bore electric fields with reference to FIG. 6. Although the above described method requires mechanical/electrical attachment of ground wires to cooling circuits, thus requiring engineering effort, the resultant shielding is worth the effort because of a dramatic reduction of in-bore electric field and associated imaging issues discussed above.

While the invention is described with reference to exemplary embodiments, it will be understood by those skilled in the art that various changes may be made an equivalence may be substituted for elements thereof without departing from the scope of the invention. In addition, many modifications may be made to the teachings of the invention to adapt to a particular situation without departing from the scope thereof. Therefore, is intended that the invention not be limited the embodiments disclosed for carrying out this invention, but that the invention includes all embodiments falling with the scope of the intended claims. Moreover, the use of the term's first, second, etc. does not denote any order of importance, but rather the term's first, second, etc. are us are used to distinguish one element from another.

What is claimed is:

1. A magnetic resonance imaging (MRI) device for imaging a volume comprising:
   a main magnet for generating a magnetic field;
   an insulator sheet formed into a tube extending along an axis, said tube defined by an inside surface and an outside surface, the outside surface disposed at a greater radial distance from a central axis of the tube than the inside surface;
   a gradient coil for manipulating the magnetic field generated by said main magnet to image said volume, said gradient coil disposed on said outside surface defining said tube;
   a RF coil; and
   a cooling circuit disposed between said gradient coil and said RF coil, said cooling circuit disposed on said inside surface defining said tube, wherein said cooling circuit shields said gradient coil from said RF coil while cooling said gradient coil.

2. The MRI device of claim 1, wherein said cooling circuit eliminates a separate RF shield.

3. The MRI device of claim 1, wherein said cooling circuit includes:
   a heat spreader having a first surface disposed on said inside surface defining said tube and an opposite second surface; and
   a plurality of cooling ducts thermally connected to said second surface of said heat spreader.

4. The MRI device of claim 3, wherein said plurality of cooling ducts are disposed as a plurality of contiguous cooling ducts electrically isolated from one another preventing gradient coil eddy current losses.

5. The MRI device of claim 4, wherein said plurality of contiguous cooling ducts are electrically isolated from one another via electrical insulation between sections defining said heat spreader.

6. The MRI device of claim 3, wherein said plurality of cooling ducts are thermally connected to said heat spreader using one of soldering and a thermally conductive adhesive.

7. The MRI device of claim 3, wherein said heat spreader and said plurality of cooling ducts are fabricated of a non-magnetic, thermally and electrically conductive material.

8. The MRI device of claim 7, wherein said non-magnetic, thermally and electrically conductive material includes copper.

9. The MRI device of claim 3, wherein said heat spreader is configured as a finned sheet.

10. The MRI device of claim 3, wherein each of said plurality of cooling ducts is electrically connected at one end to an electrically grounded manifold and non-electrically connected to another manifold at an opposite second end defining said each of said plurality of cooling ducts.

11. The MRI device of claim 1, wherein a ground wire is electrically coupled to an exposed hose barb of said cooling circuit.

12. The MRI device of claim 11, wherein a ground wire from each cooling circuit is connected together and grounded at a single point.

13. The MRI device of claim 12, wherein said single point includes one of a flange on one end of said main magnet and a grounded manifold.

14. The MRI device of claim 1, wherein said cooling circuit is operably coupled to a chiller recirculating heat exchanger.

15. A magnetic resonance imaging (MRI) device for imaging a volume, comprising:
    means for generating a main magnetic field;
    means for manipulating the main magnetic field to image the volume;
    a means for cooling said means manipulating the main magnetic field to image the volume;
    an insulator sheet formed into a tube extending along an axis, said tube defined by an inside surface and an outside surface, said outside surface disposed at a greater radial distance from a central axis of the tube than said inside surface, said insulator sheet intermediate said means for manipulating the main magnetic field to image the volume and said cooling means; and
    a RF coil spaced apart and extending radially inwardly from said cooling means,
    wherein said cooling means is disposed on said inside surface defining said tube, wherein said cooling means shields said means for manipulating the main magnetic field to image the volume from said RF coil while cooling said means for manipulating the main magnetic field to image the volume.

16. The MRI device of claim 15, wherein said cooling means is grounded to substantially reduce induction of eddy currents by magnetic fields generated by said means for manipulating the main magnetic field to image the volume.

17. A magnetic resonance imaging (MRI) system, comprising:
    a superconductor magnet for generating a magnetic field for imaging a volume;
    an unshielded gradient coil for manipulating the magnetic field;
    a RF coil; and
    a cryocooling system including a cooling circuit thermally coupled to said superconductor magnet, said cooling circuit shields said gradient coil from said RF coil while cooling said gradient coil.

18. The MRI system of claim 17, wherein said cooling circuit includes a cooled thermal spreader having an insulator sheet disposed thereon on which said gradient coil is wound.

19. The MRI system of claim 18, wherein said cooled thermal shield comprises:
    a finned sheet; and
    at least one cooling tube wrapped around said finned sheet opposite said insulator sheet, said at least one cooling tube being coupled to a chilled recirculating heat exchanger.

20. A magnetic resonance imaging (MRI) device for imaging a volume, comprising:
    at least one superconducting coil operating at cryogenic temperatures for generating a magnetic field;
    at least one gradient coil for manipulating the magnetic field generated by said at least one main magnet to image said volume;
    a RF coil; and
    a cooled thermal spreader having at least one cooling duct abutting gradient coil layers providing RF shielding from said RF coil, said at least one cooling tube being coupled to a cryocooler heat exchanger.

21. A magnetic resonance imaging (MRI) device for imaging a volume, comprising:
    at least one main magnet for generating a magnetic field;
    at least one gradient coil for manipulating the magnetic field generated by said at least one main magnet to image said volume;

at least one cooled thermal spreader comprising a cooled coil former on which said gradient coil is wound; and a RF coil, the cooled coil former disposed between said RF coil and said at least one gradient coil, said at least one gradient coil disposed at a greater radial distance from a central axis of said cooled coil former than said RF coil.

22. The MRI device of claim 21, wherein said coil former comprises:

a copper finned sheet; and at least one copper cooling tube wrapped around said coil former, said at least one cooling tube being coupled to a cryocooler heat exchanger.

23. A method of combining a cooling circuit and a RF shield for a magnetic resonance imaging (MRI) device for imaging a volume, the method comprising:

forming an insulator sheet into a tube extending along an axis, said tube defined by an inside surface and an outside surface, the outside surface disposed at a greater radial distance from a central axis of the tube than the inside surface;

disposing a gradient coil for manipulating a magnetic field generated by a main magnet to image the volume on the outside surface of said tube; and disposing a cooling circuit on the inside surface of said tube, said cooling circuit being disposed between said gradient coil and a RF coil, wherein said cooling circuit shields said gradient coil from said RF coil while cooling said gradient coil.

\* \* \* \* \*